(12) United States Patent
Kondo et al.

(10) Patent No.: US 12,341,476 B2
(45) Date of Patent: Jun. 24, 2025

(54) POWER AMPLIFIER CIRCUIT

(71) Applicant: Murata Manufacturing Co., Ltd., Kyoto-fu (JP)

(72) Inventors: Masao Kondo, Nagaokakyo (JP); Yasunari Umemoto, Nagaokakyo (JP); Shaojun Ma, Nagaokakyo (JP); Shinnosuke Takahashi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 671 days.

(21) Appl. No.: 17/506,752

(22) Filed: Oct. 21, 2021

(65) Prior Publication Data

US 2022/0173702 A1 Jun. 2, 2022

(30) Foreign Application Priority Data

Nov. 27, 2020 (JP) ................................. 2020-197253

(51) Int. Cl.
*H03F 1/30* (2006.01)
*H03F 3/24* (2006.01)

(52) U.S. Cl.
CPC ............. *H03F 1/301* (2013.01); *H03F 3/245* (2013.01); *H03F 2200/447* (2013.01); *H03F 2200/451* (2013.01)

(58) Field of Classification Search
CPC .... H03F 1/301; H03F 3/245; H03F 2200/447; H03F 2200/451; H03F 2200/411; H03F 3/191; H03F 1/302; H03F 3/21
USPC .......................................................... 330/291
See application file for complete search history.

(56) References Cited

U.S. PATENT DOCUMENTS

2004/0150479 A1* 8/2004 Abe ........................ H03F 3/04
330/296

FOREIGN PATENT DOCUMENTS

| CN | 103822728 B | 8/2016 |
|---|---|---|
| CN | 103825558 B | 8/2016 |
| JP | 2018-142688 A | 9/2018 |

* cited by examiner

*Primary Examiner* — Andrea Lindgren Baltzell
*Assistant Examiner* — Khiem D Nguyen
(74) *Attorney, Agent, or Firm* — Studebaker Brackett PLLC

(57) ABSTRACT

A power amplifier circuit includes an amplification unit, a heating unit, and a control circuit. The amplification unit is configured to amplify a radio-frequency signal. The heating unit is provided adjacent to the amplification unit. The heating unit includes one or more transistors configured to generate heat that increases as the passing current increases. The control circuit is coupled to the one or more transistors. The control circuit is configured to increase the passing current when the environmental temperature is a predetermined threshold or lower.

11 Claims, 19 Drawing Sheets

POWER AMPLIFIER CIRCUIT

CROSS-REFERENCE TO RELATED APPLICATION

This application claims benefit of priority to Japanese Patent Application No. 2020-197253, filed Nov. 27, 2020, the entire content of which is incorporated herein by reference.

BACKGROUND

Technical Field

The present disclosure relates to a power amplifier circuit.

Background Art

Power amplifier circuits for amplifying radio-frequency (RF) signals are utilized for communication by mobile objects such as portable terminals. RF signals can be efficiently amplified by known control methods. These methods include envelope tracking (ET) and average power tracking (APT). With ET or APT, electric power is amplified by using supply voltage variable in accordance with the amplitude of RF signal.

The relationship between the amplitude of RF signal and supply voltage is set in a control integrated circuit (IC). Supply voltage may be set to reach, for example, up to about 5.5 V.

For a power amplifier circuit including a transistor configured to receive supply voltage, it is necessary not to damage the transistor at any time even if the output load changes, when the environmental temperature, which is the temperature of the outside of the power amplifier circuit, is within a predetermined range of, for example, −30 to 85° C.

Japanese Unexamined Patent Application Publication No. 2018-142688 indicates that, for the purpose of preventing damage to the transistor, a clamp circuit consisting of a plurality of diodes coupled in series with each other is provided between the output of the transistor and the ground. The clamp circuit has a function of suppressing voltage rise over a predetermined threshold by turning on diodes when the voltage amplitude of output signal excessively increases.

SUMMARY

However, there is a problem in which, when the output load changes, a transistor in the output stage is damaged at the maximum supply voltage (for example, a voltage of 5.5 V or lower) at a low environmental temperature (for example, −30° C.).

The present disclosure has been made in consideration of the above circumstances, and provides a power amplifier circuit including a transistor of improved breakdown withstand voltage in low-temperature environments.

A power amplifier circuit according to one aspect of the present disclosure includes an amplification unit, a heating unit, and a control circuit. The amplification unit is configured to amplify a radio-frequency signal. The heating unit is provided adjacent to the amplification unit. The heating unit includes one or more heating elements configured to generate heat that increases as the passing current increases. The control circuit is coupled to the heating elements. The control circuit is configured to increase the passing current when the environmental temperature is a predetermined threshold or lower.

A power amplifier circuit according to another aspect of the present disclosure includes an output transistor, a bias circuit unit, and a control circuit. The output transistor is configured to amplify a radio-frequency signal and output the radio-frequency signal. The output transistor is configured to generate heat that increases as the passing current increases. The bias circuit unit is configured to supply a bias current or voltage to the output transistor. The control circuit is coupled to the bias circuit unit. The control circuit is configured to increase the bias current or voltage when the environmental temperature is a predetermined threshold or lower.

The present disclosure can provide a power amplifier circuit including a transistor of improved breakdown withstand voltage in low-temperature environments.

Other features, elements, characteristics and advantages of the present disclosure will become more apparent from the following detailed description of preferred embodiments of the present disclosure with reference to the attached drawings.

DETAILED DESCRIPTION

Figure 1:
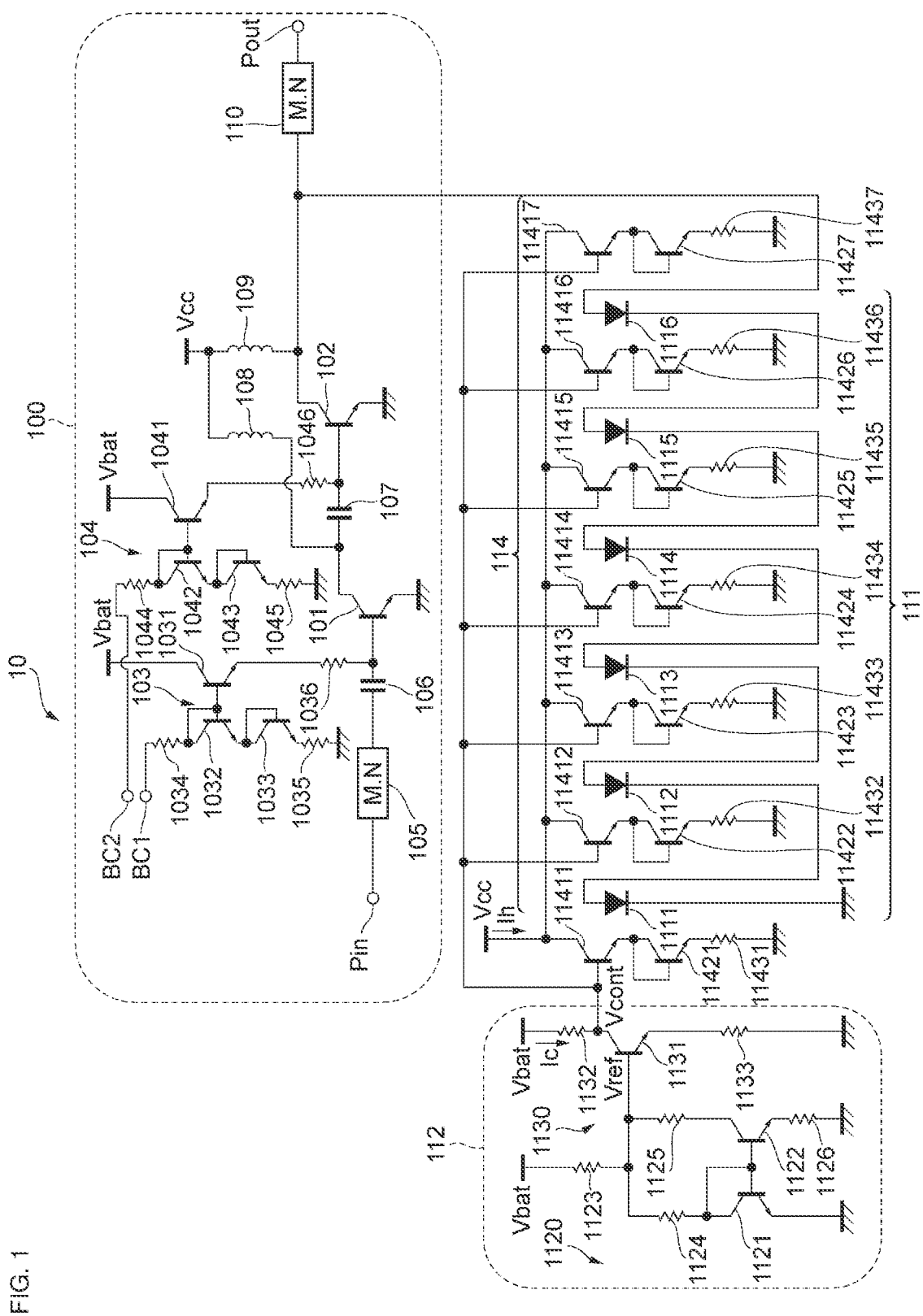
FIG. 1 is a circuit diagram of a power amplifier circuit according to a first embodiment.

The following is a description of a first embodiment. FIG. 1 illustrates a circuit diagram of the power amplifier circuit 10 according to the first embodiment. The power amplifier circuit 10 includes an amplifier circuit 100, a clamp circuit 111, a heating unit 114, and a control circuit 112.

The amplifier circuit 100 includes a transistor 101, an output transistor 102, bias circuits 103 and 104, matching networks 105 and 110, capacitors 106 and 107, inductors 108 and 109, and resistance elements 1036 and 1046.

The base of the transistor 101 is coupled to an input end Pin via the matching network 105 and the capacitor 106. The bias circuit 103 supplies a bias current or voltage to the base of the transistor 101. A supply voltage Vcc is supplied to the collector of the transistor 101 through the inductor 108. The emitter of the transistor 101 is grounded. The transistor 101 amplifies a radio-frequency signal inputted via the input end Pin and outputs the amplified radio-frequency signal to the base of the output transistor 102.

The base of the output transistor 102 is coupled to the collector of the transistor 101 via the capacitor 107. The bias circuit 104 supplies a bias current or voltage to the base of the output transistor 102. The supply voltage Vcc is supplied to the collector of the output transistor 102 through the inductor 109. The emitter of the output transistor 102 is grounded. The output transistor 102 amplifies a signal from the transistor 101 and outputs an output signal from the collector of the output transistor 102 to an output terminal Pout through the matching network 110.

The bias circuit 103 includes transistors 1031, 1032, and 1033 and resistance elements 1034 and 1035.

The base of the transistor 1031 is coupled to the resistance element 1034; the collector of the transistor 1031 is coupled to a power supply; the emitter of the transistor 1031 is coupled to the resistance element 1036. The transistor 1031 is switched on or off by a current, based on a control current supplied from a control input end BC1 through the resistance element 1034, supplied to the base of the transistor 1031. When the transistor 1031 is switched on, the transistor 1031 outputs a bias current or voltage.

The transistor 1032 is a diode-connected transistor in which the collector is coupled to the resistance element 1034 and the base of the transistor 1031, and the emitter is coupled to the collector of the transistor 1033. The transistor 1032 outputs a current to the collector of the transistor 1033 in response to the current flowing into the collector of the transistor 1032.

The transistor 1033 is also a diode-connected transistor in which the collector is coupled to the emitter of the transistor 1032, and the emitter is grounded via the resistance element 1035. The transistor 1033 outputs from the emitter a current based on the current from the transistor 1032.

The resistance elements 1034 and 1035 are provided to cause predetermined voltage drop in accordance with the control current.

The resistance element 1036 is provided between the collector of the transistor 1031 and the base of the transistor 101. The resistance element 1036 is provided to cause predetermined voltage drop in accordance with the bias current form the transistor 1031.

The bias circuit 104 includes transistors 1041, 1042, and 1043 and resistance elements 1044 and 1045. The components of the bias circuit 104 are coupled to each other in the same manner as the bias circuit 103. The bias circuit 104 supplies a bias current or voltage to the base of the output transistor 102. The resistance element 1046 is provided to cause predetermined voltage drop in accordance with the bias current form the transistor 1041.

The matching network 105 is provided between the input end Pin and the capacitor 106. The matching network 105 performs impedance matching between the input end Pin and the base of the transistor 101.

The capacitor 106 is provided between the matching network 105 and the base of the transistor 101. The capacitor 106 has a function of cutting off the direct-current component of the signal inputted to the transistor 101.

The capacitor 107 is provided between the collector of the transistor 101 and the base of the output transistor 102. The capacitor 107 has a function of cutting off the direct-current component of the signal inputted to the output transistor 102.

The inductor 108 is provided between the collector of the transistor 101 and a power line for supplying the supply voltage Vcc. The inductor 109 is provided between the collector of the transistor 101 and the power line for supplying the supply voltage Vcc. The inductors 108 and 109 both function as choke inductors.

The matching network 110 performs impedance matching between the collector of the output transistor 102 and the output terminal Pout.

The clamp circuit 111 includes diodes 1111 to 1116. The diodes 1111 to 1116 are coupled in series with each other. The clamp circuit has a function of suppressing voltage rise over a predetermined threshold by turning on diodes when the voltage amplitude of output signal excessively increases.

The heating unit 114 includes transistors 11411 to 11417, transistors 11421 to 11427, and resistance elements 11431 to 11437.

The base of the transistor 11411 (unit transistor) is coupled to a control circuit described later. The control circuit supplies a control voltage to the transistor 11411. The collector of the transistor 11411 is coupled to a power line for supplying the supply voltage Vcc. The transistor 11411 outputs a passing current having passed through the transistor 11411. The passing current is based on the control voltage.

The transistor 11421 is a diode-connected transistor in which the collector is coupled to the emitter of the transistor 11411. The emitter of the transistor 11421 is grounded via the resistance element 11431.

The control circuit 112 supplies the control voltage to the transistors 11412 to 11417 in the same manner as the transistor 11411. The transistors 11422 to 11427 and the resistance elements 11432 to 11437 are coupled to each other in the same manner as the transistor 11421 and the resistance element 11431.

The control circuit 112 includes a reference-voltage generation circuit 1120 and a control transistor unit 1130. The reference-voltage generation circuit 1120 includes transistors 1121 and 1122 and resistance elements 1123, 1124, 1125, and 1126.

The reference-voltage generation circuit 1120 is a current mirror circuit. The reference-voltage generation circuit 1120 outputs an output voltage (reference voltage) Vref exhibiting a small degree of temperature dependence.

The control transistor unit 1130 includes a control transistor 1131 and resistance elements 1132 and 1133. A supply voltage Vbat is supplied to the collector of the control transistor 1131 through the resistance element 1132. The emitter of the control transistor 1131 is grounded via the resistance element 1133. The reference-voltage generation circuit 1120 supplies the reference voltage Vref to the base of the control transistor 1131. The collector of the control transistor 1131 is coupled to the base of the transistor 11411 to the base of the transistor 11417 to supply a control voltage Vcont to each base.

The transistors provided in the control circuit 112 are bipolar transistors. However, the transistors may be field effect transistors (FETs); in this case, the emitter, collector, and base are replaced with the source, drain, and gate of FET. The control circuit 112 may be disposed at the same semiconductor chip as the power amplifier circuit 10 or a different semiconductor chip on the same semiconductor module as the power amplifier circuit 10.

The following description relates to the operation of the control circuit 112 and the operation of the heating unit 114 when temperature decreases. The reference voltage Vref outputted by the reference-voltage generation circuit 1120 hardly depends on the environmental temperature. By contrast, the on-voltage, that is, the base-emitter voltage across the control transistor 1131 increases as the environmental temperature decreases. Thus, a current Ic flowing through the control transistor 1131 and the resistance element 1132 decreases as the environmental temperature decreases. Because the current Ic decreases, the voltage drop across the resistance element 1132 decreases. As a result, the control voltage Vcont applied to the base of the transistor 11411 to the base of the transistor 11417 increases.

As the environmental temperature decreases, the base-emitter voltage of the transistor 11411 and the base-emitter voltage of the transistor 11421 also increases. To increase the current flowing through the transistors 11411 and 11421 as the environmental temperature decreases, the resistance of the resistance element 1132 and the amount of the current Ic are set such that the increase in the on-voltage of the control transistor 1131 due to decreases in the environmental temperature exceeds the total of the increase in the on-voltage of the transistors 11411 and the increase in the on-voltage of the transistor 11421.

Figure 2:
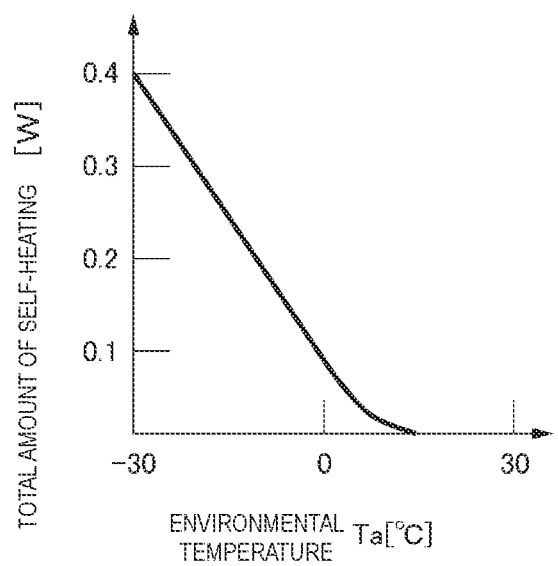
FIG. 2 is a graph for explaining an operation of the power amplifier circuit according to the first embodiment.

FIG. 2 illustrates a plot of the product of a current Ih, which is the total current flowing through the transistors 11411 to 11417, by the supply voltage Vcc, that is, the total amount of self-heating of the transistors 11411 to 11417 and the transistors 11421 to 11427 versus an environmental temperature Ta. As the environmental temperature Ta increases, the total amount of self-heating decreases. When the environmental temperature Ta is about 10° C., the total amount of self-heating is zero.

The transistors 11411 to 11417 and the transistors 11421 to 11427, which generate heat in this manner, heat the diodes 1111 to 1116 by self-heating when the environmental temperature decreases.

Figure 3:
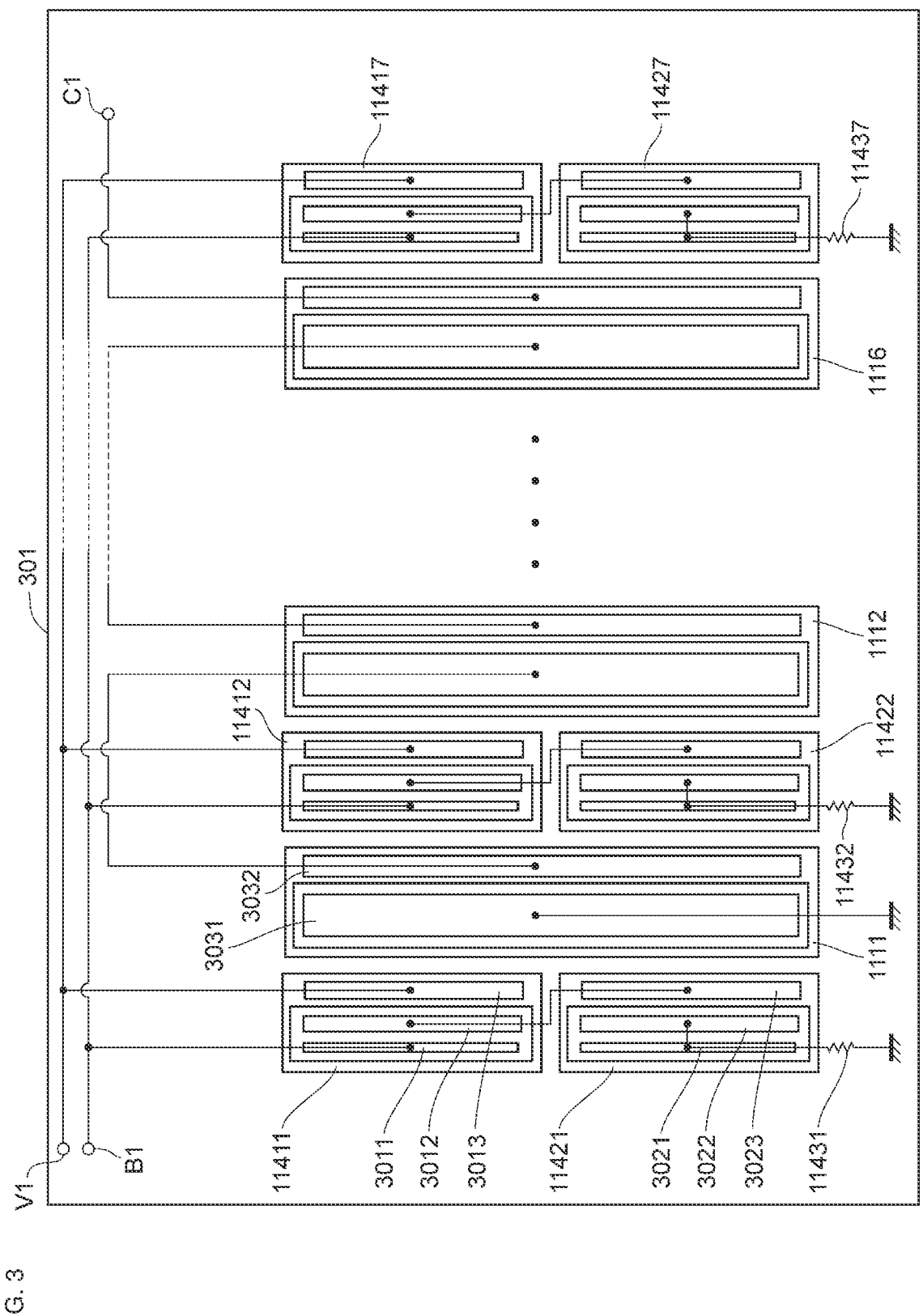
FIG. 3 illustrates a layout of the power amplifier circuit according to the first embodiment.

Referring to FIG. 3, a layout of the heating unit and the clamp circuit will be described. The diodes 1111 to 1116 are disposed at a chip 301 such that the longitudinal direction of each diode is an identical direction; the diodes 1111 to 1116 are spaced apart by a given distance from each other perpendicularly to the longitudinal direction.

The transistors 11411 to 11417 and the transistors 11421 to 11427 are also disposed at the chip 301. Each transistor has a base, an emitter, and a collector; for example, the transistor 11411 has a base 3011, an emitter 3012, and a collector 3013; similarly, the transistor 11421 has a base 3021, an emitter 3022, and a collector 3023. The transistors 11411 and 11421 are provided as a pair and aligned in the same longitudinal direction. Likewise, other transistors in pairs including the pair of the transistors 11412 and 11422 are disposed at spaces between the arrays of the diodes 1111 to 1116 or on both sides with respect to the diodes 1111 to 1116; the other transistors are disposed such that the longitudinal direction of each diode is identical to the longitudinal direction of the diodes 1111 to 1116.

FIG. 3 also illustrates connections between nodes of the components, which corresponds to the circuit connections illustrated in FIG. 1. The supply voltage Vcc is supplied from a terminal V1. The control voltage Vcont is supplied from a terminal B1. A terminal C1 is coupled between the output transistor 102 and the matching network 110. An output signal is outputted through the terminal C1. A voltage according to the output is applied to the diodes 1111 to 1116.

The transistors 11411 to 11417 and the transistors 11421 to 11427 heat the diodes 1111 to 1116 by self-heating when the environmental temperature decreases. Because the diodes 1111 to 1116 are heated, the on-voltage of each diode does not increase as the environmental temperature decreases. By controlling the on-voltage of each diode not to increase, the clamp circuit is switched on at a given level of voltage or lower, and as a result, it is possible to avoid damage to the output transistor 102 when the environmental temperature decreases.

The following is a description of a second embodiment. In the second and subsequent embodiments, descriptions about specifics common to the first embodiment are not repeated and only different points will be explained. In particular, almost identical effects and advantages achieved by almost identical configurations are not mentioned in every embodiment.

Figure 4:
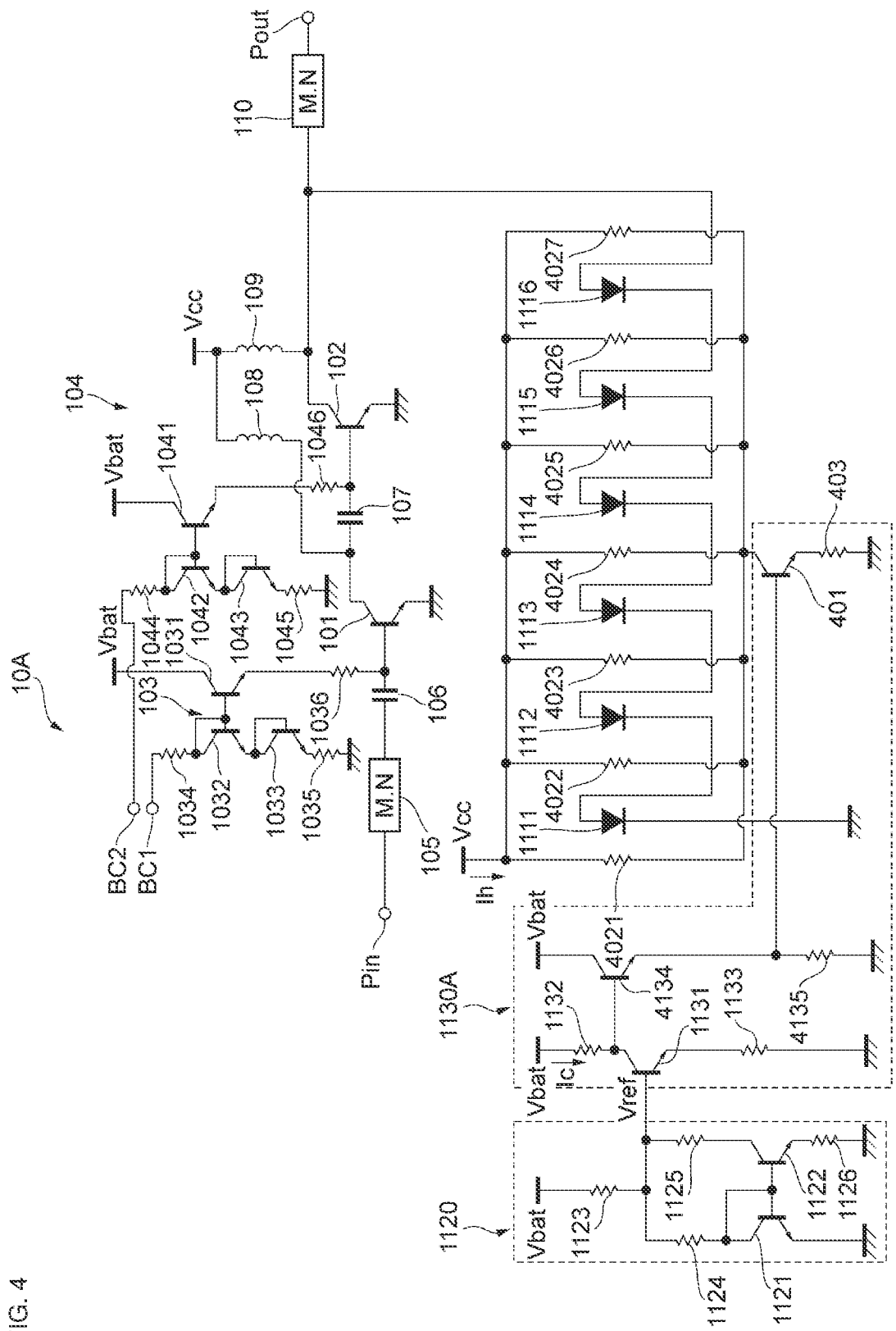
FIG. 4 is a circuit diagram of a power amplifier circuit according to a second embodiment.

FIG. 4 is a circuit diagram of a power amplifier circuit 10A according to the second embodiment. The power amplifier circuit 10A according to the second embodiment differs from the power amplifier circuit 10 according to the first embodiment in part of the configuration of the heating unit and part of the configuration of the control circuit.

In the power amplifier circuit 10A, the heating unit includes resistance elements 4021 to 4027. The resistance elements are coupled in parallel with each other between a power line for supplying the supply voltage Vcc and the collector of a transistor 401 described later.

In the power amplifier circuit 10A, a control transistor unit 1130A includes the transistor 401, a transistor 4134, and resistance elements 403 and 4135 in addition to the configuration of the control transistor unit 1130 of the first embodiment.

The collector of the transistor 401 is coupled to the resistance elements 4021 to 4027; the emitter of the transistor 401 is grounded via the resistance element 403; the base of the transistor 401 is coupled to the emitter of the transistor 4134.

The base of the transistor 4134 is coupled to the collector of the control transistor 1131; the collector of the transistor 4134 is coupled to a power line for supplying the supply voltage Vbat; the emitter of the transistor 4134 is coupled to the resistance element 4135 and the transistor 401. The emitter of the transistor 4134 is grounded via the resistance element 4135.

The following description relates to the operation of the power amplifier circuit 10A when temperature decreases. When temperature decreases, the current Ic flowing through the control transistor 1131 decreases in the same manner as the description of the power amplifier circuit 10. As a result, the base voltage of the transistor 4134 increases, so that the current flowing through the transistor 4134 increases. The voltage drop across the resistance element 4135 thus increases, and the base voltage of the transistor 401 increases. Consequently, the current Ih flowing through the transistor 401 increases. Due to the current Ih flowing, the resistance elements 4021 to 4027 generate heat to apply heat to the diodes 1111 to 1116.

Figure 5:
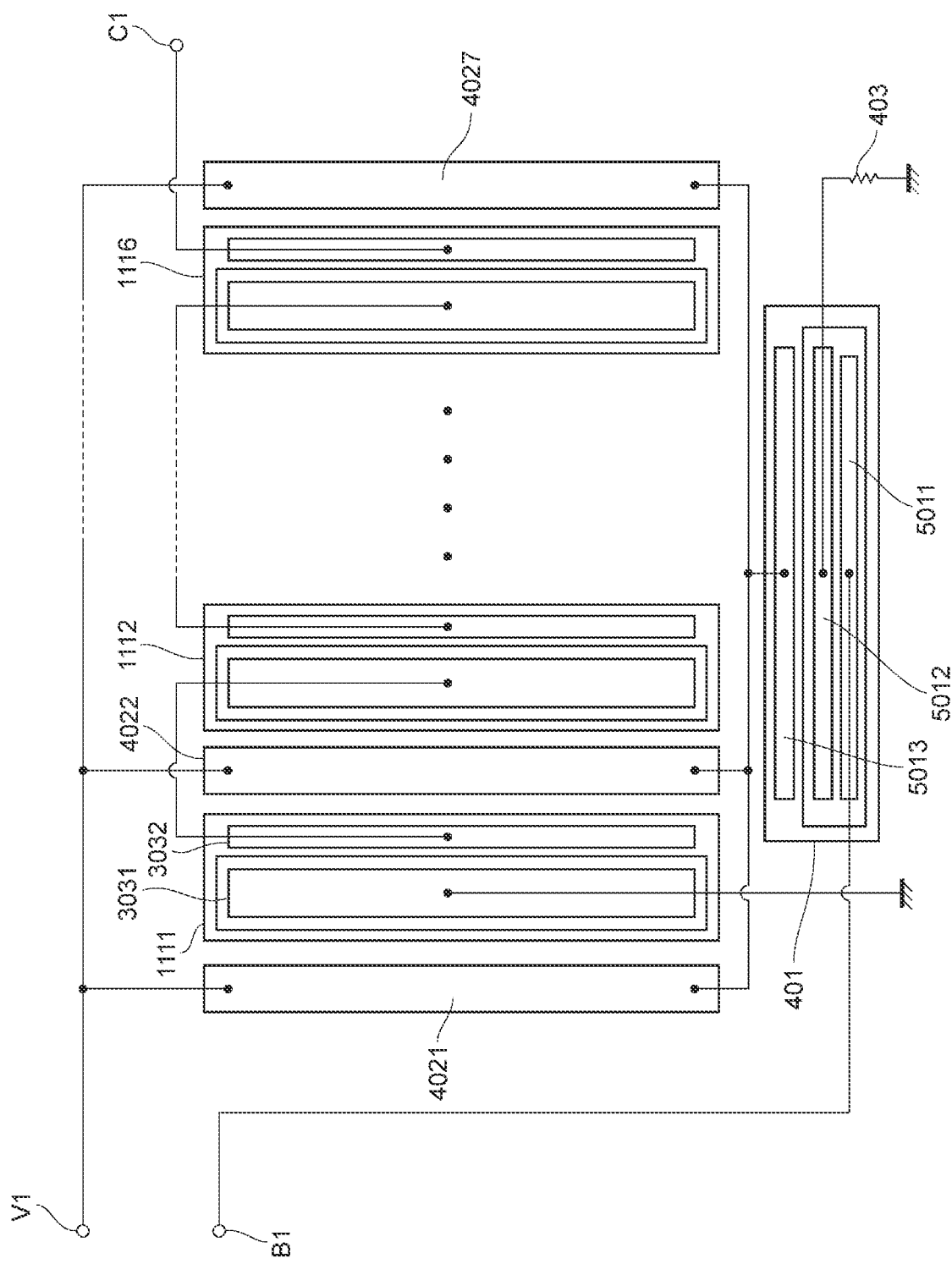
FIG. 5 illustrates a layout of the power amplifier circuit according to the second embodiment.

FIG. 5 illustrates an arrangement of the components of the power amplifier circuit 10A. The diodes 1111 to 1116 are disposed in the same manner as in FIG. 3. In FIG. 5, the resistance elements 4021 to 4027 are disposed adjacent to the diodes 1111 to 1116. The transistor 401, which has a base 5011, an emitter 5012, and a collector 5013, is disposed such that the resistance elements are arrayed in the longitudinal direction of the transistor 401. FIG. 5 also illustrates connections between nodes of the components.

By providing the resistance elements 4021 to 4027 to apply heat, it is possible to suppress decreases in the on-voltage of the diode when temperature decreases. Furthermore, the area including the resistance elements of the power amplifier circuit 10A is smaller than the area including the heating elements of the power amplifier circuit 10, and as a result, it is possible to reduce the size of the chip equipped with the power amplifier circuit and manufacturing costs.

Figure 6:
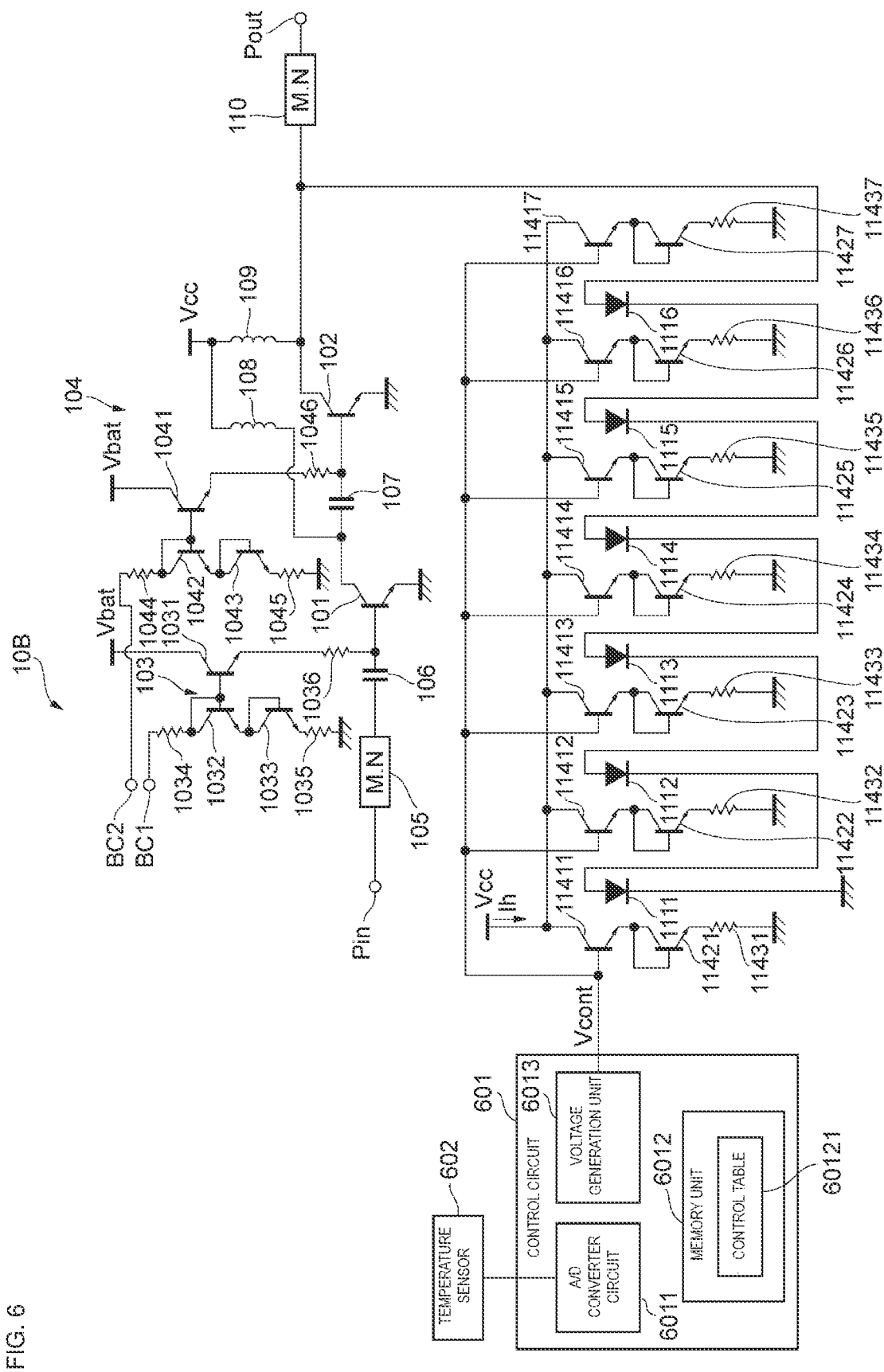
FIG. 6 is a circuit diagram of a power amplifier circuit according to a third embodiment.

The following is a description of a third embodiment. FIG. 6 is a circuit diagram of a power amplifier circuit 10B according to the third embodiment. The power amplifier circuit 10B differs from the power amplifier circuit 10 in the configuration of the control circuit.

A control circuit 601 of the power amplifier circuit 10B includes an analog-to-digital (A/D) converter circuit 6011 (temperature acquisition unit), a memory unit 6012, a voltage generation unit 6013. The control circuit 601 is coupled to a temperature sensor 602.

The A/D converter circuit 6011 converts an analog temperature signal inputted by the temperature sensor 602 for measuring the environmental temperature into a digital signal.

The memory unit 6012 stores a control table 60121 for specifying the control voltage Vcont in accordance with the converted digital temperature signal.

The voltage generation unit 6013 is coupled to the base of the transistor 11411 to the base of the transistor 11417. The voltage generation unit 6013 outputs the control voltage Vcont in accordance with the control table 60121.

The following description relates to the operation of the power amplifier circuit 10B when temperature decreases. The temperature sensor 602 transmits a temperature signal to the A/D converter circuit 6011. When the environmental temperature decreases, the voltage generation unit 6013 generates a voltage in accordance with the converted digital temperature signal and the control table 60121 so as to increase the control voltage Vcont to be supplied to the base of the transistor 11411 to the base of the transistor 11417.

Figure 7:
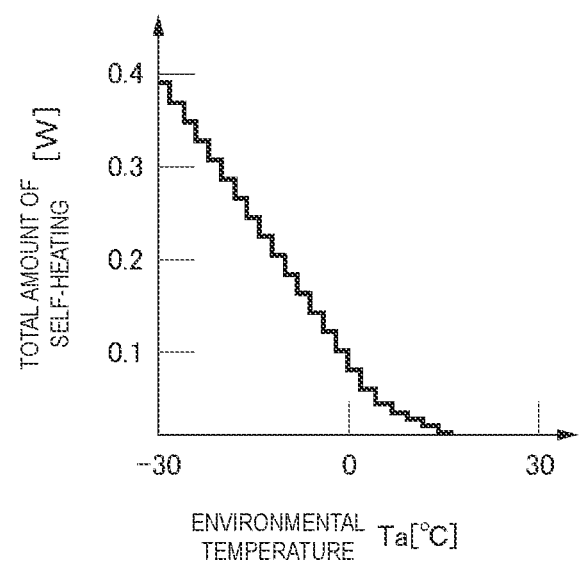
FIG. 7 is a graph for explaining an operation of the power amplifier circuit according to the third embodiment.

FIG. 7 illustrates a plot of the product of the current Ih by the supply voltage Vcc, that is, the total amount of self-heating versus the environmental temperature Ta, similarly to FIG. 2. As the environmental temperature Ta increases, the total amount of self-heating decreases. When the environmental temperature Ta is about 10° C., the total amount of self-heating is zero. The plot illustrated in FIG. 7 differs from the plot illustrated in FIG. 2 in that the total amount of self-heating changes in a quantal manner in accordance with digital signal.

Because the power amplifier circuit 10B uses digital signal for control, the power amplifier circuit 10B can achieve a degree of accuracy of control higher than the degree in the case of analog signal and also reduce power consumption.

The control circuit 601 may be disposed at a semiconductor chip different from the semiconductor chip including the power amplifier circuit 10B or the same semiconductor chip as the power amplifier circuit 10B. The temperature sensor 602 may be disposed at the same semiconductor chip as the power amplifier circuit 10B or a semiconductor chip different from a semiconductor chip including the power amplifier circuit 10B; the temperature sensor 602 may be disposed at a given position in a portable terminal including a semiconductor chip.

Figure 8:
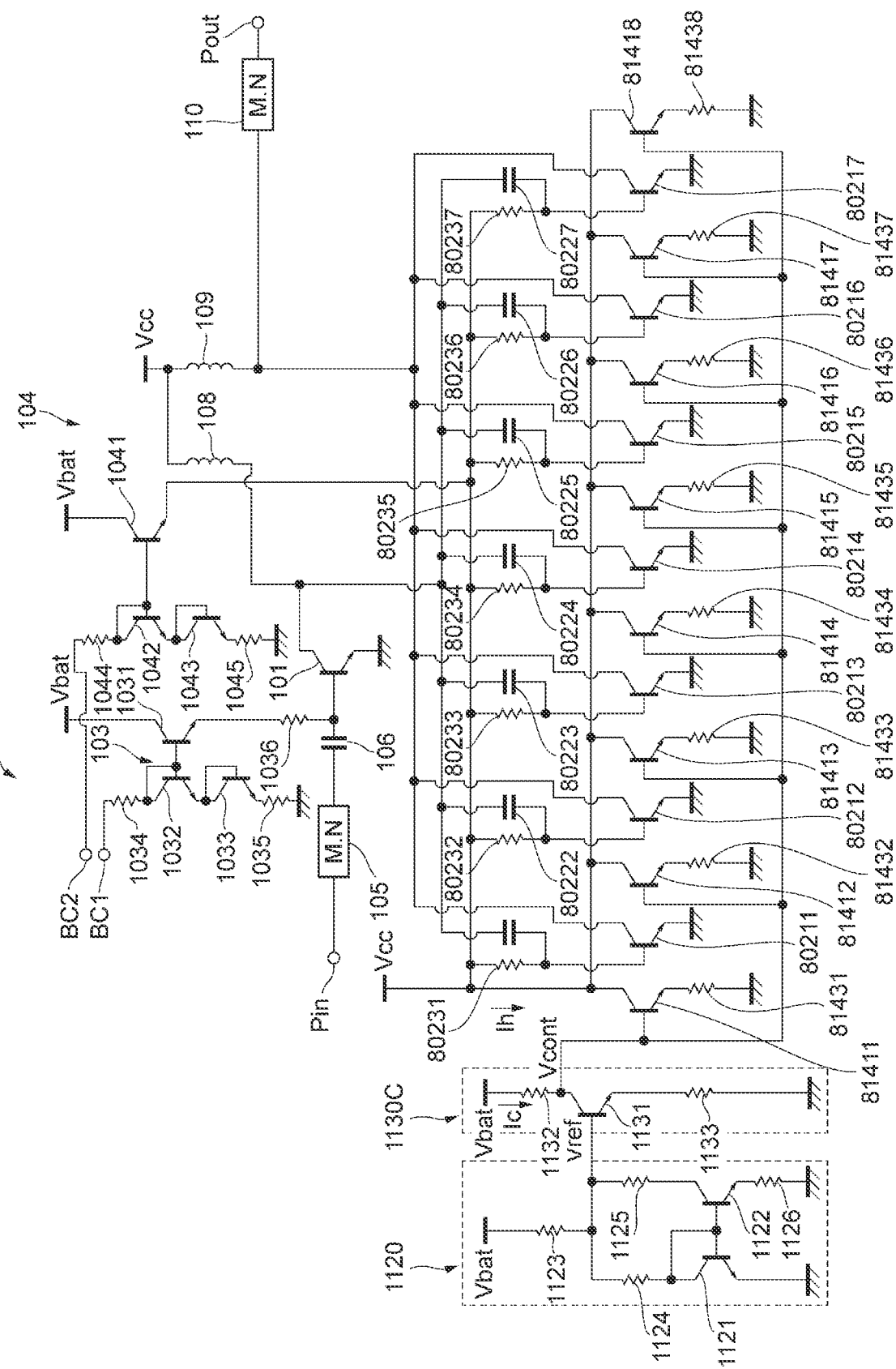
FIG. 8 is a circuit diagram of a power amplifier circuit according to a fourth embodiment.

The following is a description of a fourth embodiment. FIG. 8 illustrates a circuit diagram of a power amplifier circuit 10C according to the fourth embodiment. The power amplifier circuit 10C differs from the power amplifier circuit 10 in that the heating unit heats a different part. Specifically, the heating unit of the power amplifier circuit 10C heats transistors for outputting an output signal from the power amplifier circuit 10C.

The power amplifier circuit 10C includes output transistors 80211 to 80217 for outputting an output signal. The output transistors 80211 to 80217 are coupled in parallel with each other. The base of the output transistor 80211 to the base of the output transistor 80217 are coupled to the transistor 101 via capacitors 80221 to 80227. The base of the output transistor 80211 to the base of the output transistor 80217 are coupled to the bias circuit 104 via the resistance elements 80231 to 80237.

The heating unit of the power amplifier circuit 10C includes transistors 81411 to 81418. The emitter of the transistor 81411 to the emitter of the transistor 81418 are grounded via resistance elements 81431 to 81438. The control voltage Vcont is supplied from the control transistor unit 1130C to the base of the transistor 81411 to the base of the transistor 81418.

The following description relates to the operation of the power amplifier circuit 10C when temperature decreases. When temperature decreases, the current Ic flowing through the control transistor 1131 decreases in the same manner as the description of the power amplifier circuit 10. The base voltage of the transistor 81411 to the base voltage of the transistor 81418 increase, and passing current flows through the transistors 81411 to 81418. As a result, the transistors 81411 to 81418 generate heat to apply heat to the output transistors 80211 to 80217.

The effect of lattice vibration is smaller when temperature decreases than if temperature is normal. Thus, an avalanche phenomenon, in which a large amount of current flows when voltage reaches a certain level, occurs easily at the output transistors 80211 to 80217 when the electric field is relatively weak. The avalanche phenomenon can cause damage to the output transistors 80211 to 80217 when the supply voltage Vcc is relatively low.

In the power amplifier circuit 10C, heating the output transistors 80211 to 80217 increases the junction temperature of the output transistors 80211 to 80217, which hinders the avalanche phenomenon; as a result, the breakdown withstand voltage of the transistor can be improved when the transistor is in low-temperature environment.

Figure 9:
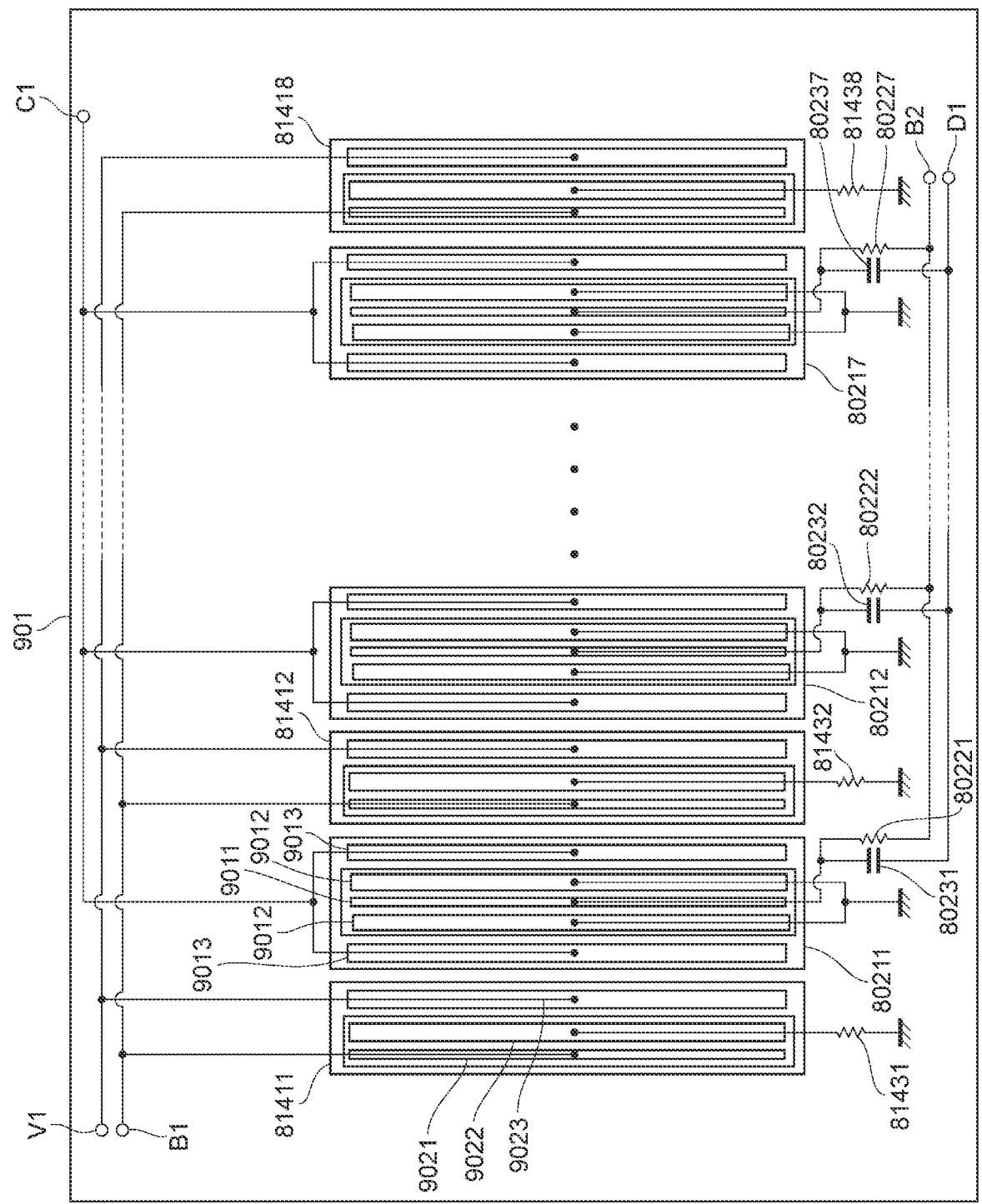
FIG. 9 illustrates a layout of the power amplifier circuit according to the fourth embodiment.

Referring to FIG. 9, a layout of the power amplifier circuit 10C will be described. The output transistors 80211 to 80217 are disposed at a chip 901 such that the longitudinal direction of each transistor is an identical direction; the output transistors 80211 to 80217 are spaced apart by a given distance from each other perpendicularly to the longitudinal direction. Each transistor has a base, an emitter, and a collector; for example, the output transistor 80211 has a base 9011, an emitter 9012, and a collector 9013.

The transistors 81411 to 81418 are disposed at the chip 901. Each transistor has a base, an emitter, and a collector; for example, the transistor 81411 has a base 9021, an emitter 9022, and a collector 9023. The transistors 81411 to 81418 are disposed at spaces between the arrays of the output transistors 80211 to 80217 or on both sides with respect to the output transistors 80211 to 80217; the transistors 81411 to 81418 are disposed such that the longitudinal direction of each transistor is identical to the direction of the output transistors 80211 to 80217.

FIG. 9 also illustrates connections between nodes of the components, which corresponds to the circuit connections illustrated in FIG. 8. The bias circuit 104 supplies a bias current or voltage to a terminal B2. A signal from the transistor 101 functioning in the driver stage is supplied to a terminal D1. The terminal C1 is coupled to the output terminal Pout side. An output signal is outputted from the terminal C1.

Figure 10:
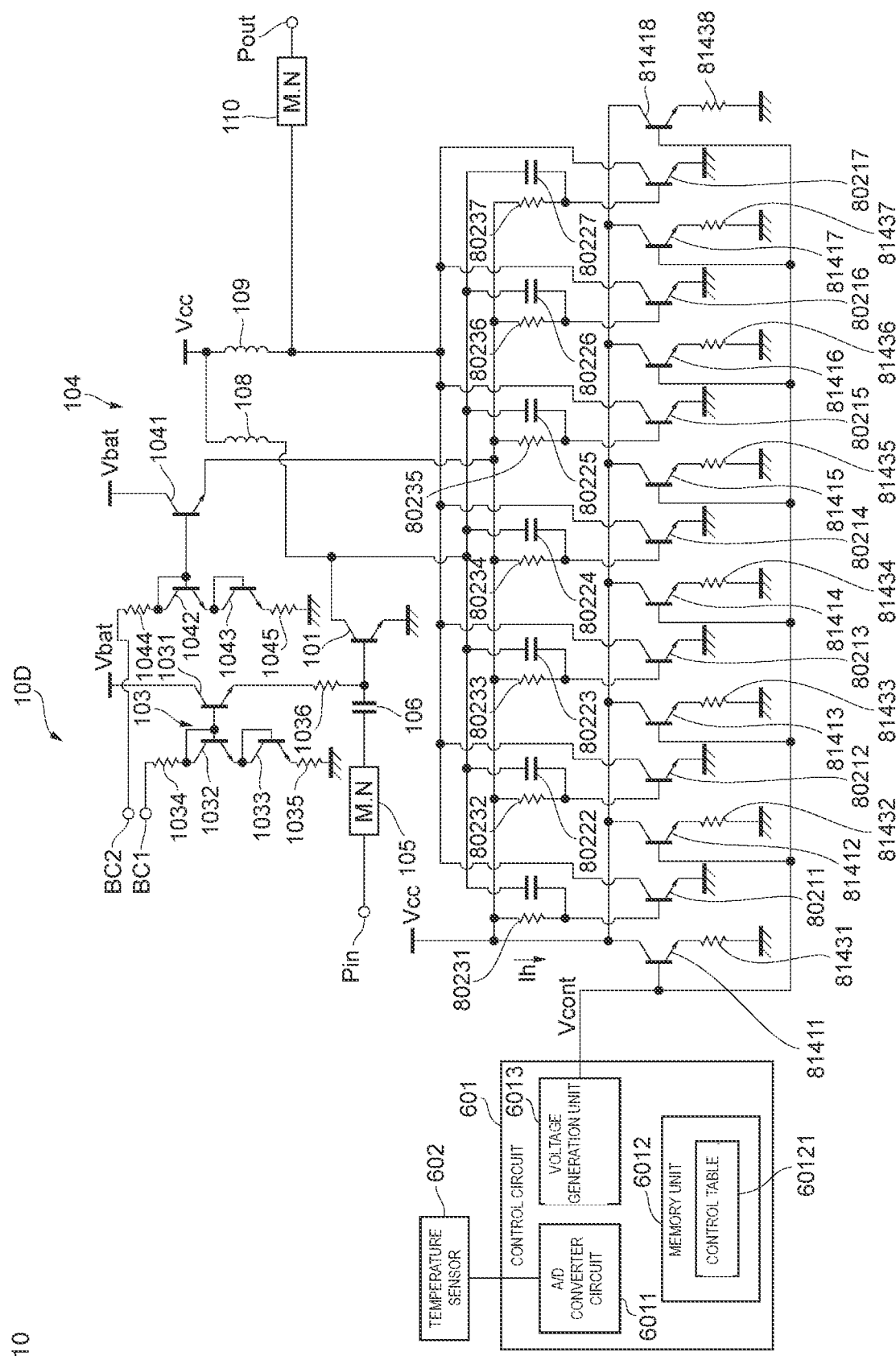
FIG. 10 is a circuit diagram of a power amplifier circuit according to a fifth embodiment.

The following is a description of a fifth embodiment. FIG. 10 is a circuit diagram of a power amplifier circuit 10D according to the fifth embodiment. The power amplifier circuit 10D is constructed by using the control circuit 601 and the temperature sensor 602 as replacements for the configuration of the control circuit in the same manner as in FIG. 6.

The following description relates to the operation of the power amplifier circuit 10D when temperature decreases. The temperature sensor 602 transmits a temperature signal to the A/D converter circuit 6011. When the environmental temperature decreases, the voltage generation unit 6013 generates a voltage in accordance with the converted digital temperature signal and the control table 60121 so as to increase the control voltage Vcont to be supplied to the base of the transistor 81411 to the base of the transistor 81418.

Because the power amplifier circuit 10D uses digital signal for control, the power amplifier circuit 10D can achieve a degree of accuracy of control higher than the degree in the case of analog signal and also reduce power consumption.

Figure 11:
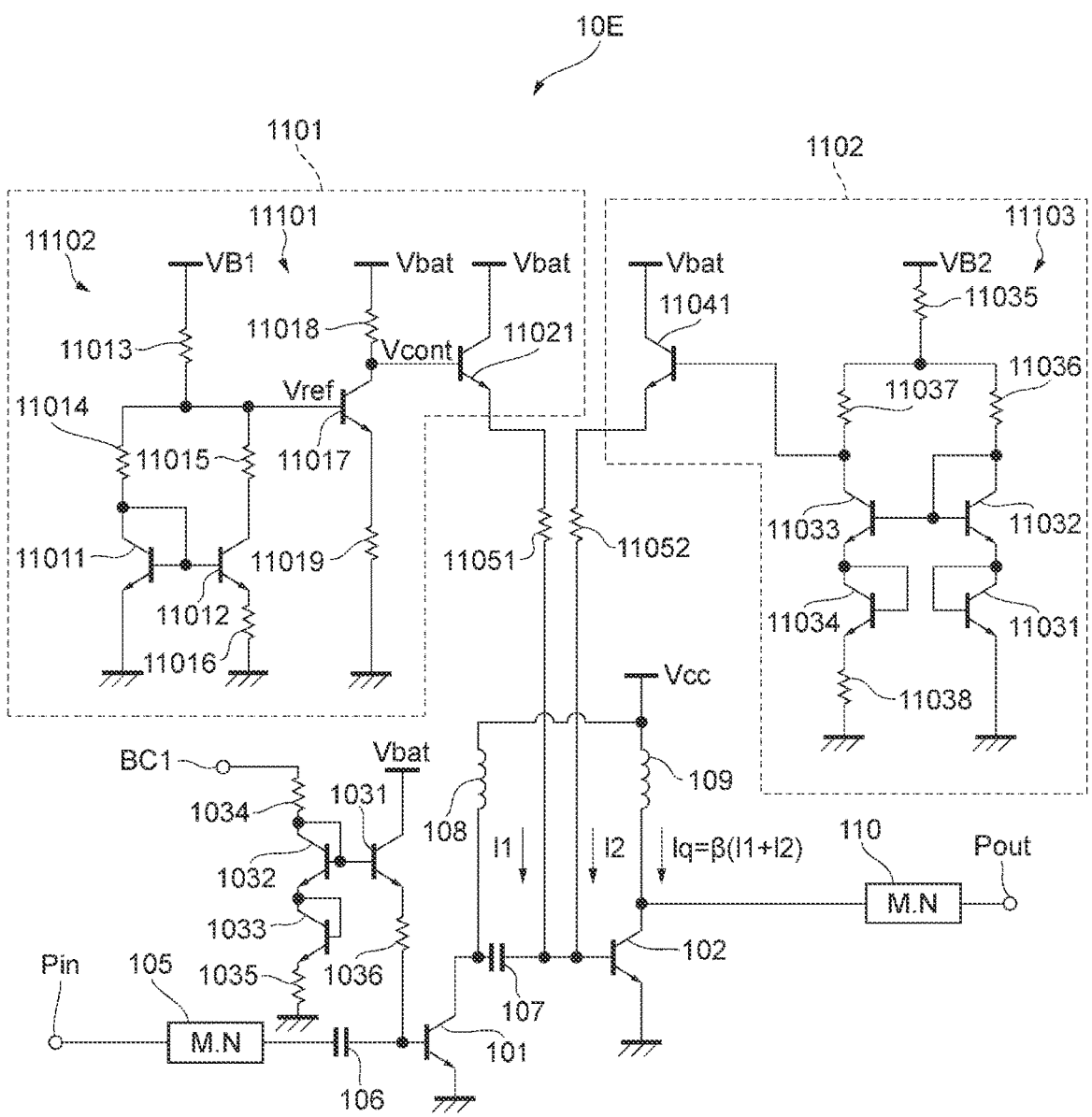
FIG. 11 is a circuit diagram of a power amplifier circuit according to a sixth embodiment.

The following is a description of a sixth embodiment. FIG. 11 illustrates a circuit diagram of a power amplifier circuit 10E according to the sixth embodiment.

The amplifier circuit of the power amplifier circuit 10E includes the transistor 101, the output transistor 102, the bias circuit 103, the matching networks 105 and 110, the capacitors 106 and 107, the inductors 108 and 109, the resistance element 1036, and resistance elements 11051 and 11052. The amplifier circuit of the power amplifier circuit 10E differs from the amplifier circuit of the power amplifier circuit 10 in not including the bias circuit 104 and the resistance element 1046. The power amplifier circuit 10E additionally includes bias circuits 1101 and 1102. In the power amplifier circuit 10E, the bias circuits 1101 and 1102 constitute a bias circuit unit.

The bias circuit 1101 (first bias circuit) includes a reference-voltage generation circuit 11102 and a control transistor unit 11101. The reference-voltage generation circuit 11102 includes transistors 11011 and 11012 and resistance elements 11013, 11014, 11015, and 11016. The reference-voltage generation circuit 11102 is a current mirror circuit. The reference-voltage generation circuit 11102 outputs the reference voltage Vref exhibiting a small degree of temperature dependence. A supply voltage VB1 is supplied to the reference-voltage generation circuit 11102 through the resistance element 11013.

The control transistor unit 11101 includes transistors 11017 and 11021 and resistance elements 11018 and 11019. The supply voltage Vbat is supplied to the collector of the transistor 11017 through the resistance element 11018. The emitter of the transistor 11017 is grounded via the resistance element 11019. The reference-voltage generation circuit 11102 supplies the reference voltage Vref to the base of the transistor 11017. The collector of the transistor 11017 is coupled to the base of the transistor 11021 to supply the control voltage Vcont to the base of the transistor 11021.

The supply voltage Vbat is supplied to the collector of the transistor 11021. The emitter of the transistor 11021 is coupled to the base of the output transistor 102 via the resistance element 11051. The transistor 11021 supplies a bias current I1 (first bias current) to the base of the output transistor 102 in response to the control voltage Vcont supplied to the base of the transistor 11021.

The bias circuit 1102 (second bias circuit) includes a reference-voltage generation circuit 11103 and a transistor 11041. The reference-voltage generation circuit 11103 includes transistors 11031, 11032, 11033, and 11034 and resistance elements 11035, 11036, 11037, and 11038. The reference-voltage generation circuit 11103 supplies a base voltage to the transistor 11041. The reference-voltage generation circuit 11103 is a current mirror circuit. The reference-voltage generation circuit 11103 is a bias circuit configured to output a current exhibiting a small degree of temperature dependence.

The transistor 11041 outputs the bias current I1 to the output transistor 102 in response to the voltage from the reference-voltage generation circuit 11103.

An idle current Iq flowing to the collector of the output transistor 102 coupled to the bias circuits 1101 and 1102 is given by the following equation: $Iq=\beta(I1+I2)$, where $\beta$ is the current gain of the output transistor 102, and I2 is a bias current supplied by the bias circuit 1102.

The following description relates to the operation of the power amplifier circuit 10E when temperature decreases. The reference voltage Vref outputted by the reference-voltage generation circuit 11102 hardly depends on the environmental temperature. By contrast, the on-voltage, that is, the base-emitter voltage across the transistor 11017 increases as the environmental temperature decreases. Thus, the current Ic flowing through the transistor 11017 and the resistance element 11018 decreases as the environmental temperature decreases.

Because the current Ic decreases, the voltage drop across the resistance element 11018 decreases. As a result, the control voltage Vcont applied to the transistor 11021 increases. As the control voltage Vcont increases, the bias current I1 increases.

By contrast, the bias current I2 (second bias current) supplied by the bias circuit 1102 hardly depends on the environmental temperature.

Figure 12:
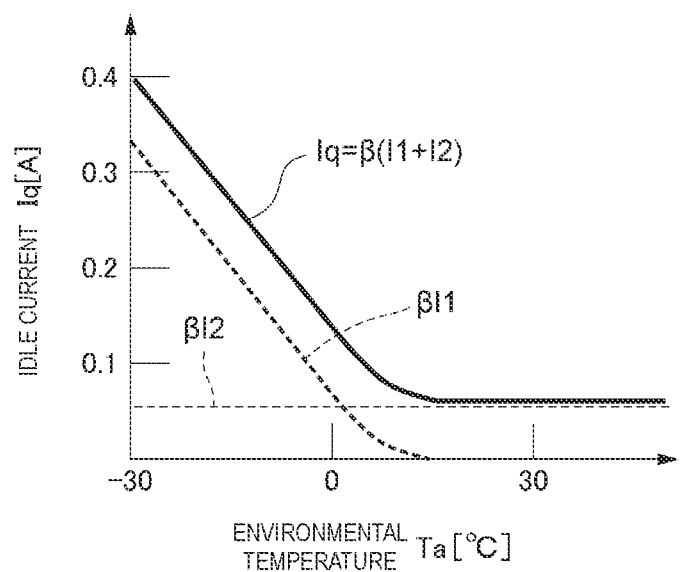
FIG. 12 is a graph for explaining an operation of the power amplifier circuit according to the sixth embodiment.

FIG. 12 illustrates a plot of an idle current $\beta I1$ from the bias circuit 1101, a plot of an idle current $\beta I2$ from the bias circuit 1102, and a plot of the idle current Iq, which is the total of the idle currents $\beta I1$ and $\beta I2$, with respect to the environmental temperature Ta. As described above, the bias current I1 decreases as the environmental temperature Ta increases; thus, when the environmental temperature Ta is about 10° C., the idle current $\beta I1$ is zero. The idle current $\beta I2$ remains constant regardless of the environmental temperature Ta. Accordingly, the idle current Iq decreases as the environmental temperature Ta increases; and after the environmental temperature Ta reaches about 10° C. or higher, the idle current Iq remains at a constant value.

Figure 13:
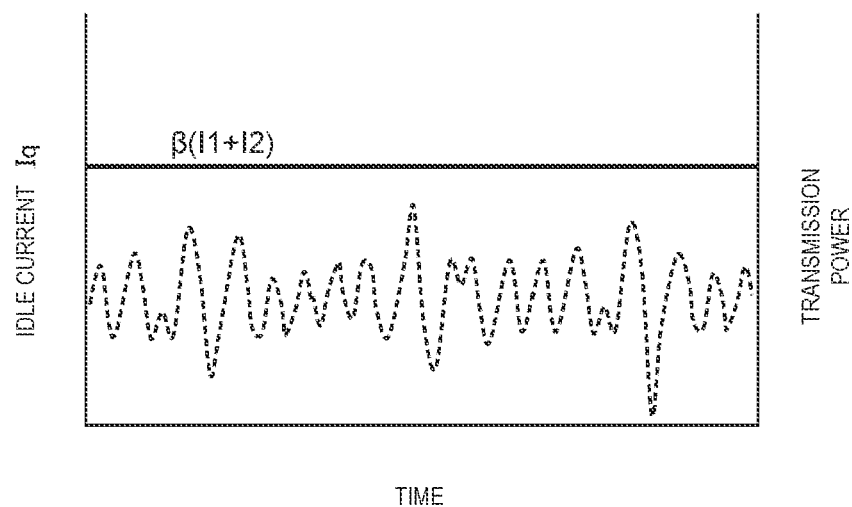
FIG. 13 is a graph for explaining idle current in the power amplifier circuit according to the sixth embodiment.

Referring to FIG. 13, changes in the idle current Iq to the output transistor 102 in the power amplifier circuit 10E will be described with respect to time. In FIG. 13, the horizontal axis indicates time, and the vertical axis indicates idle current and transmission power. A solid line represents idle current. A dashed line represents transmission power.

The power amplifier circuit 10E operates in a frequency division duplex (FDD) system. Thus, transmission power is continuously outputted as illustrated in FIG. 13, and the output transistor 102 continuously provides amplification. The idle current Iq is determined in accordance with the environmental temperature Ta to be maintained at a given value of β(I1+I2).

When temperature is relatively low, the idle current Iq is continuously increased to a temperature higher than the normal temperature by increasing the bias current I1. As such, the power amplifier circuit 10E is controlled to operate in a manner close to class A. As a result, power-added efficiency is decreased, and self-heating is increased. Along with rises in temperature, the idle current Iq comes to a particular low value of βI2, and as a result, self-heating is reduced. As such, when the environmental temperature Ta is a particular value or higher, the amount of idle current is maintained to be constant.

The transistors in the bias circuits 1101 and 1102 are bipolar transistors. However, the transistors may be FETs; in this case, the emitter, collector, and base are replaced with the source, drain, and gate of FET.

The power amplifier circuit 10E does not need to include transistors especially for heating. Thus, the area occupied by transistors can be reduced, and manufacturing costs can be accordingly decreased.

Figure 14:
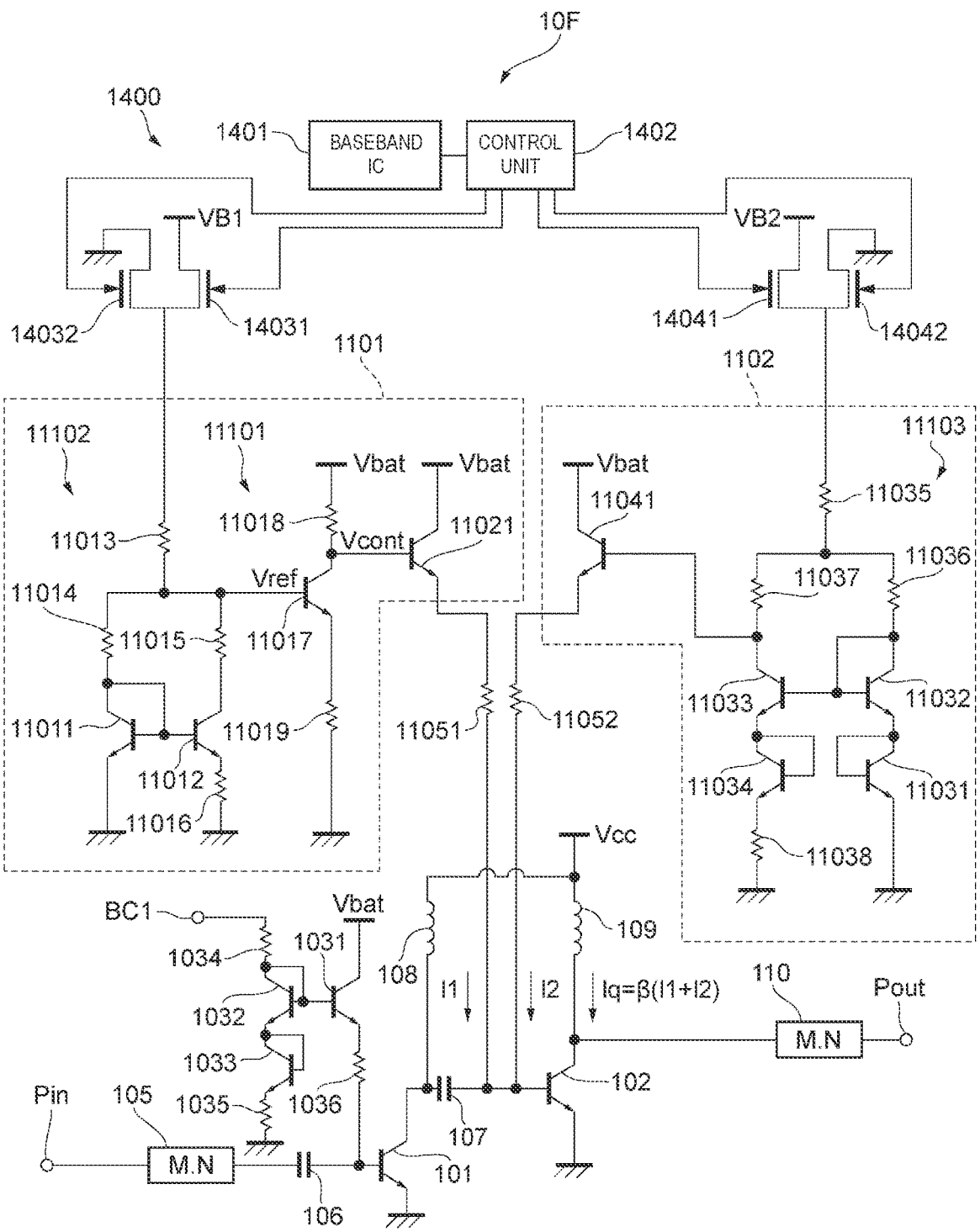
FIG. 14 is a circuit diagram of a power amplifier circuit according to a seventh embodiment.

The following is a description of a seventh embodiment. FIG. 14 illustrates a circuit diagram of a power amplifier circuit 10F according to the seventh embodiment.

The power amplifier circuit 10F is constructed by adding a baseband integrated circuit (IC) 1401, a control unit 1402, and switches 14031, 14032, 14041, and 14042 to the power amplifier circuit 10E. The baseband IC 1401, the control unit 1402, and the switches 14031, 14032, 14041, and 14042 are elements of a bias selection circuit 1400. The power amplifier circuit 10F provides amplification for communication using time division duplexing (TDD).

The baseband IC 1401 outputs a signal indicating a transmit time slot, in which signals need to be amplified, or a receive time slot, in which signals do not need to be amplified, in communication using TDD.

In accordance with the signal from the baseband IC 1401, the control unit 1402 outputs signals for turning on or off the switches 14031, 14032, 14041, and 14042.

The switch 14031 controls connection and disconnection between the bias circuit 1101 and a power line for supplying the supply voltage VB1. The switch 14032 controls connection and disconnection between the bias circuit 1101 and the ground. This means that the switches 14031 and 14032 can turn on or off the bias circuit 1101.

The switch 14041 controls connection and disconnection between the bias circuit 1102 and a power line for supplying a supply voltage VB2. The switch 14042 controls connection and disconnection between the bias circuit 1102 and the ground. This means that the switches 14041 and 14042 can turn on or off the bias circuit 1102.

In the power amplifier circuit 10F, the switches 14031, 14032, 14041, and 14042 are turned on or off to operate either the bias circuit 1101 or 1102.

The switches 14031, 14032, 14041, and 14042 are implemented by, for example, FETs. The switches 14031, 14032, 14041, and 14042 and the control unit 1402 may be integrated at the same semiconductor chip as the power amplifier circuit 10F or a semiconductor chip different from the semiconductor chip including the power amplifier circuit 10F.

Figure 15:
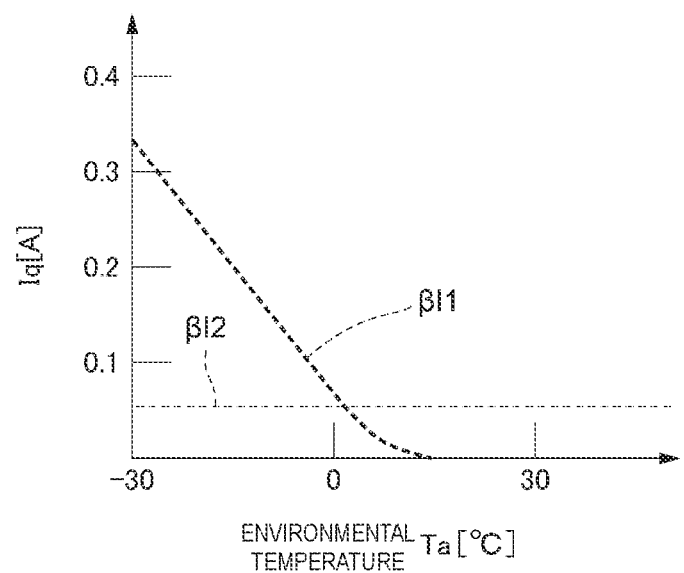
FIG. 15 is a graph for explaining an operation of the power amplifier circuit according to the seventh embodiment.

FIG. 15 illustrates a plot of the idle current βI1 from the bias circuit 1101 and a plot of the idle current βI2 from the bias circuit 1102 in the power amplifier circuit 10F with respect to the environmental temperature Ta. As described above, the bias current I1 decreases as the environmental temperature Ta increases; thus, when the environmental temperature Ta is about 10° C., the idle current βI1 is zero. The idle current βI2 remains constant regardless of the environmental temperature Ta.

Figure 16:
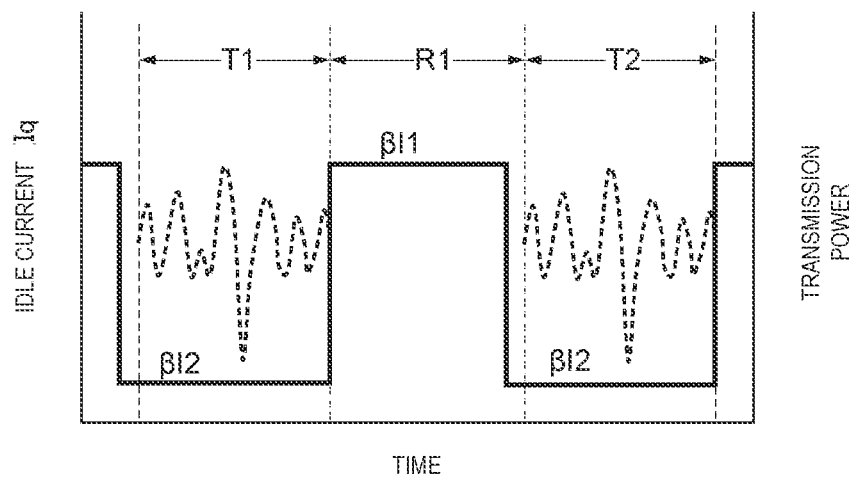
FIG. 16 is a graph for explaining idle current in the power amplifier circuit according to the seventh embodiment.

Referring to FIG. 16, changes in the idle current Iq to the output transistor 102 in the power amplifier circuit 10F will be described with respect to time. In FIG. 16, the horizontal axis indicates time, and the vertical axis indicates idle current and transmission power. A solid line represents idle current. A dashed line represents transmission power.

The power amplifier circuit 10F operates in a TDD system. Thus, as illustrated in FIG. 16, transmission power is outputted in transmit time slots T1 and T2. The output transistor 102 provides amplification in only the transmit time slots T1 and T2. By contrast, transmission power is not outputted in a receive time slot R1, and thus, the output transistor 102 does not provide amplification.

In the transmit time slots T1 and T2, the control unit 1402 controls the bias circuit 1102 to supply the bias current I2. In the receive time slot R1, the control unit 1402 controls the bias circuit 1101 to supply the bias current I1.

This means that, during the receive time slot R1 without amplification, the bias circuit configured to output the bias current I1 when the environmental temperature is relatively low provides a large amount of current corresponding to the environmental temperature to the output transistor 102, and as a result, the output transistor 102 heat itself by self-heating. As such, the breakdown withstand voltage of the transistor can be improved when the transistor is in low-temperature environment.

Moreover, in the case of TDD, output signals are used to generate heat during transmit time, whereas a bias current larger than transmit time is supplied to the output transistor 102 during receive time; consequently, the output transistor 102 can be heated more efficiently than when the bias currents I1 and I2 are supplied during both transmit and receive times.

Figure 17:
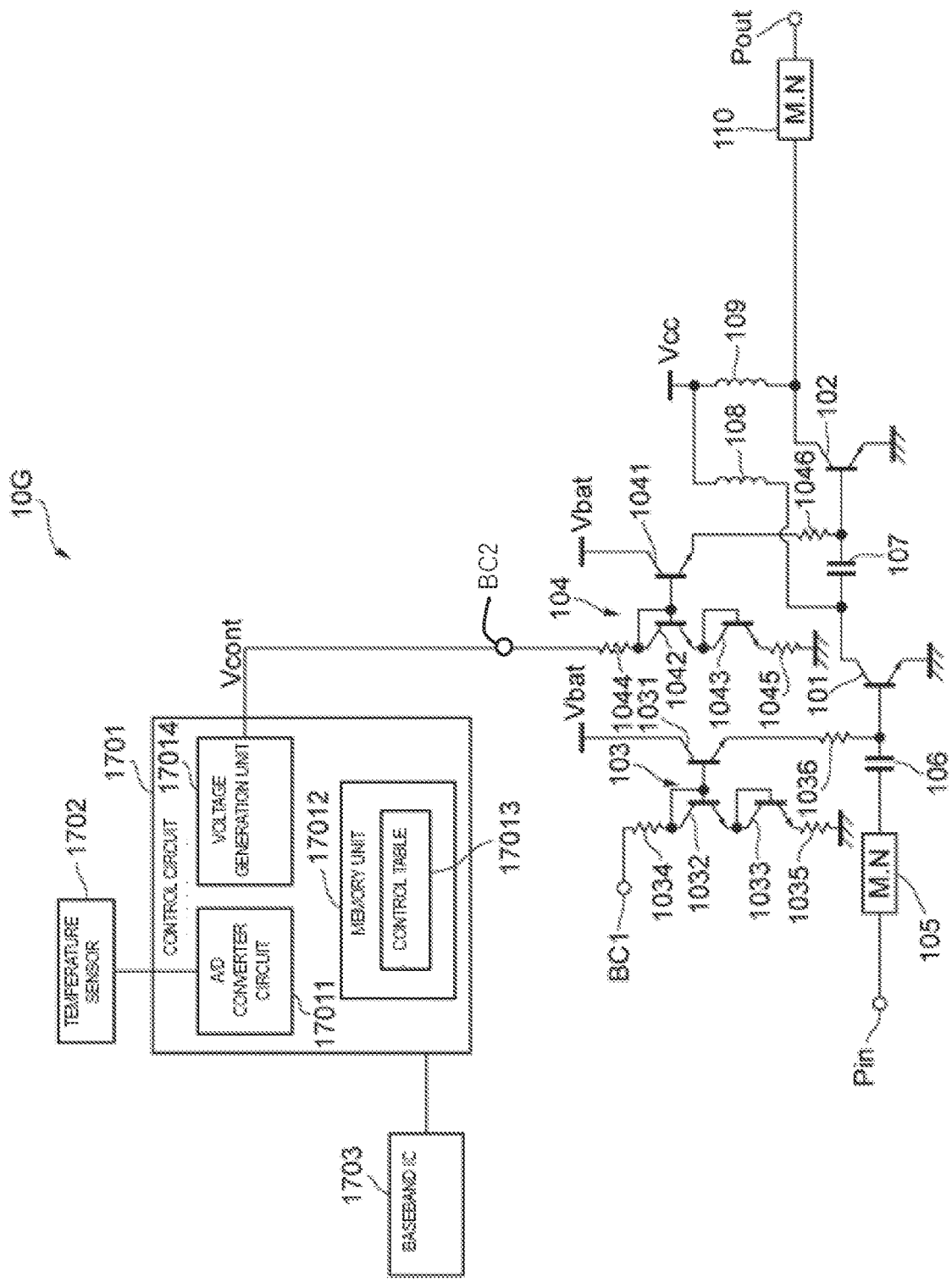
FIG. 17 is a circuit diagram of a power amplifier circuit according to an eighth embodiment.

The following is a description of an eighth embodiment. FIG. 17 illustrates a circuit diagram of a power amplifier circuit 10G according to the eighth embodiment.

The amplifier circuit of the power amplifier circuit 10G includes the transistor 101, the output transistor 102, the bias circuits 103 and 104, the matching networks 105 and 110, the capacitors 106 and 107, the inductors 108 and 109, and the resistance elements 1036 and 1046, as in the power amplifier circuit 10. In the power amplifier circuit 10G, the bias circuit 104 is a bias circuit unit. The power amplifier circuit 10G includes a control circuit 1701, a temperature sensor 1702, and a baseband IC 1703.

The control circuit 1701 includes an A/D converter circuit 17011, a memory unit 17012, and a voltage generation unit 17014. The control circuit 1701 is coupled to the temperature sensor 1702.

The A/D converter circuit 17011 converts an analog temperature signal inputted by the temperature sensor 1702 for measuring the environmental temperature into a digital signal.

The memory unit 17012 stores a control table 17013 for specifying the control voltage Vcont in accordance with a signal from the baseband IC 1703 and the converted digital temperature signal.

The voltage generation unit 17014 is coupled to a terminal BC2 of the bias circuit 104. The voltage generation unit 17014 outputs the control voltage Vcont in accordance with the control table 17013.

The baseband IC 1703 inputs to the control circuit 1701 a signal for distinguishing transmit time slot and receive time slot. The temperature sensor 1702 inputs to the control circuit 1701 an analog signal obtained by the temperature sensor 1702 measuring the environmental temperature. The A/D converter circuit 17011 converts the temperature signal into a digital signal. The signal from the baseband IC 1703 and the converted digital temperature signal are transferred to the memory unit 17012. In accordance with the control table 17013 stored in the memory unit 17012, a voltage to be outputted by the voltage generation unit 17014 is determined. The voltage generation unit 17014 supplies to the bias circuit 104 a voltage according to the determined voltage.

When the environmental temperature is relatively low, the voltage generation unit 17014 supplies to the output transistor 102 bias currents that enable the idle current in a receive time slot to be higher than the idle current in a transmit time slot.

Because the power amplifier circuit 10G utilizes a digital control circuit to control the idle current flowing to the output transistor 102 in accordance with the environmental temperature, it is possible to improve the accuracy of control and reduce power consumption in comparison to the case of an analog circuit.

Figure 18:
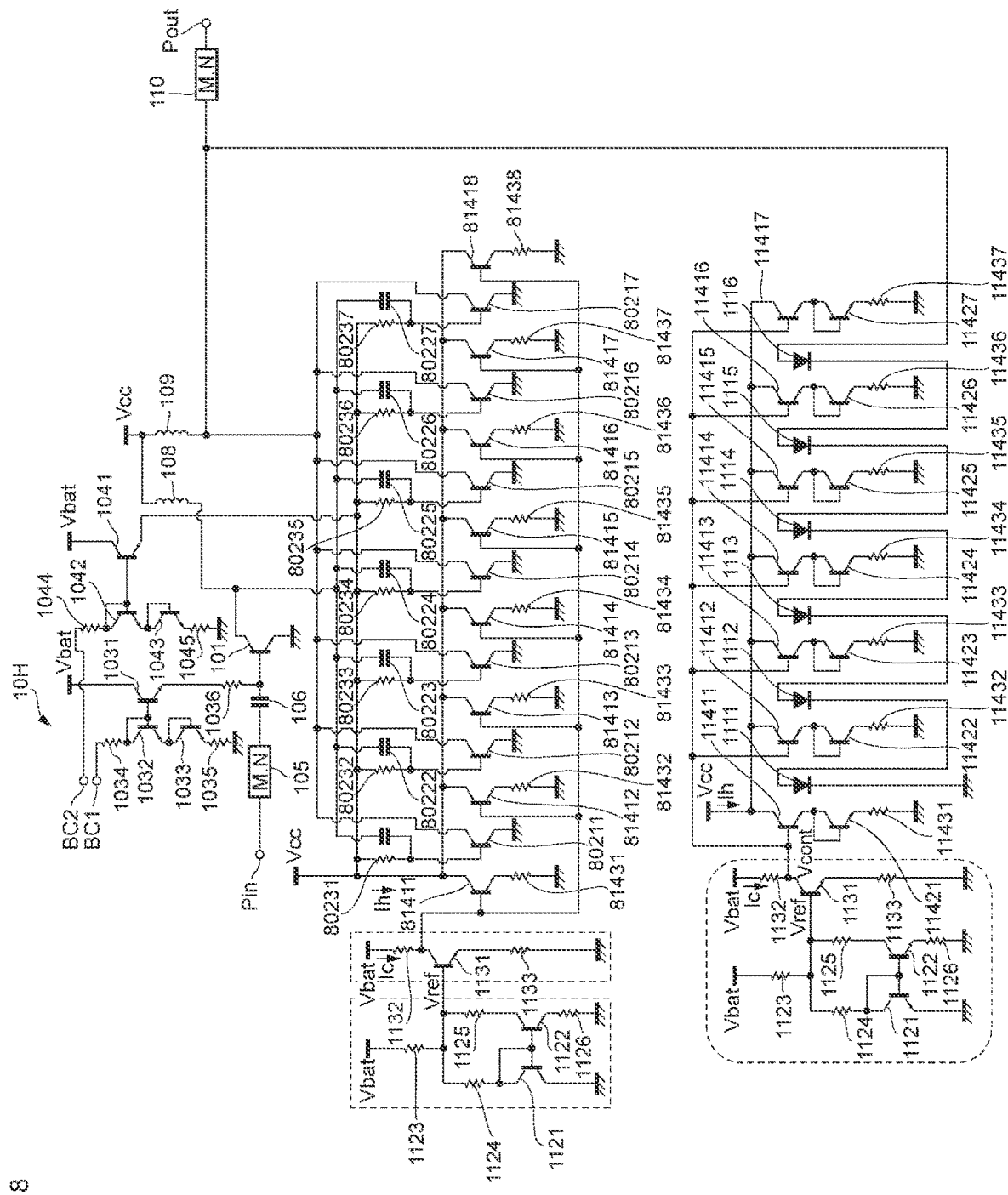
FIG. 18 is a circuit diagram of a power amplifier circuit according to a ninth embodiment.

The following is a description of a ninth embodiment. FIG. 18 illustrates a circuit diagram of a power amplifier circuit 10H according to the ninth embodiment. The power amplifier circuit 10H is constructed by combining a configuration for heating diodes including the diode 1111 and a configuration for heating output transistors including the output transistor 80211. This configuration can improve the breakdown withstand voltage of the output-stage transistor in lower-temperature environment.

Figure 19:
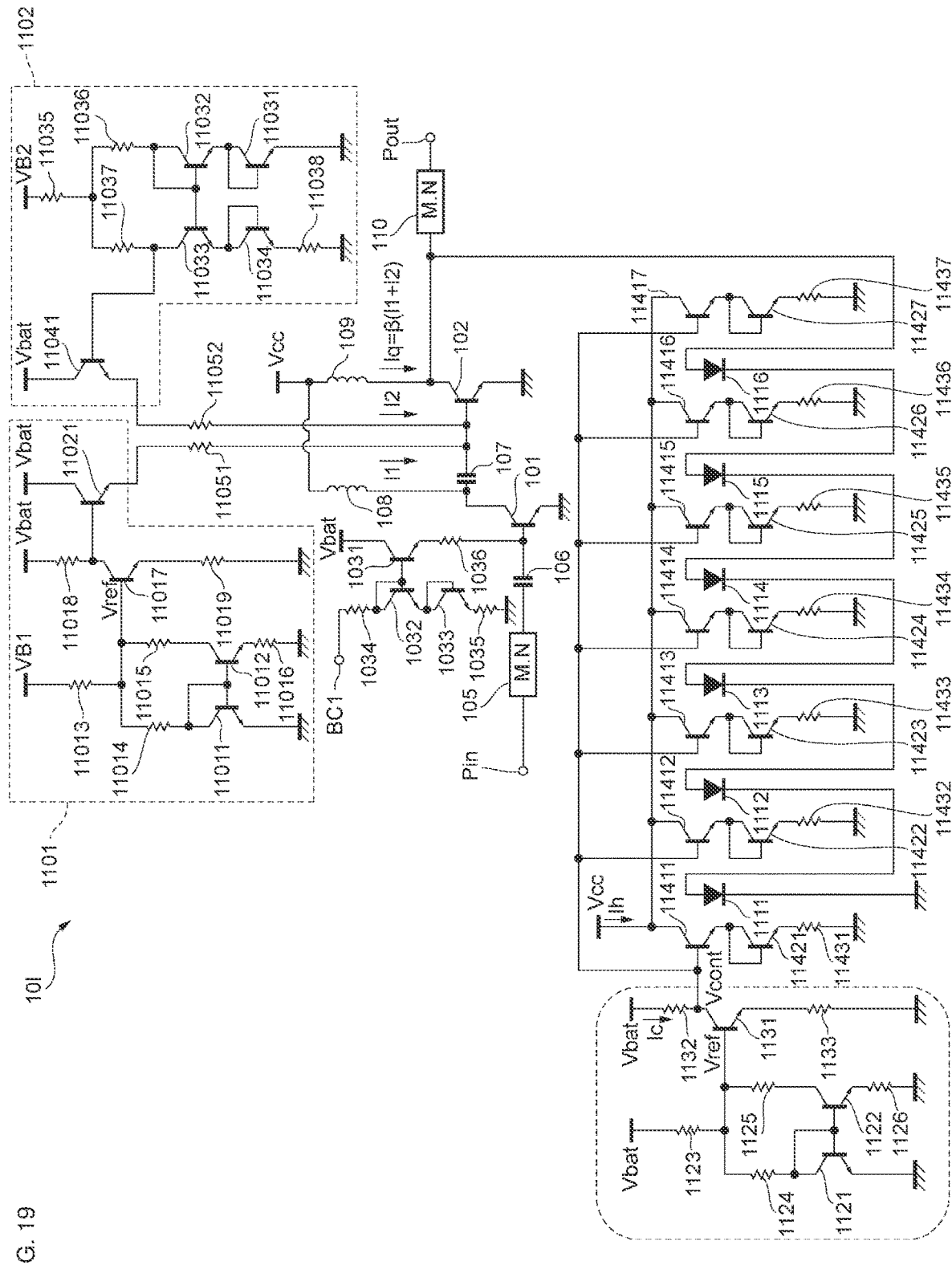
FIG. 19 is a circuit diagram of a power amplifier circuit according to a tenth embodiment.

The following is a description of a tenth embodiment. FIG. 19 illustrates a circuit diagram of a power amplifier circuit 10I according to the tenth embodiment. The power amplifier circuit 10I is constructed by combining a configuration for heating diodes including the diode 1111 and a configuration for heating the output transistor 102 by idle current. This configuration can improve the breakdown withstand voltage of the output-stage transistor in lower-temperature environment. Furthermore, it is unnecessary to provide transistors especially for heating. Thus, this configuration can achieve an effect of reducing the area occupied by output-stage transistors and an effect of decreasing manufacturing costs.

The exemplary embodiments of the present disclosure have been described above. The power amplifier circuit 10 includes an amplification unit, the heating unit 114, and the control circuit 112. The amplification unit is configured to amplify a radio-frequency signal. The heating unit 114 is provided adjacent to the amplification unit. The heating unit 114 includes one or more transistors including the transistor 11411 configured to generate heat that increases as the passing current increases. The control circuit 112 is coupled to the one or more transistors including the transistor 11411. The control circuit 112 is configured to increase the passing current when the environmental temperature is a predetermined threshold or lower.

With this configuration, when the environmental temperature is the predetermined threshold or lower, components of the amplification unit can be heated by activating the transistors including the transistor 11411. As a result, the breakdown withstand voltage of the transistor can be improved when the transistor is in low-temperature environment. Current for heating is supplied to the transistors including the transistor 11411 only when the environmental temperature is extremely low, and thus, power consumption of the portable terminal does not considerably increase. Accordingly, it is possible to prevent the battery from being out of charge only after a very short period of time unless the portable terminal is continuously used in extremely low-temperature environment.

In the power amplifier circuit 10, the control circuit 112 includes the reference-voltage generation circuit 1120 and the control transistor unit 1130. The reference-voltage generation circuit 1120 is configured to generate the reference voltage Vref.

The reference-voltage generation circuit 1120 supplies to the control transistor unit 1130 the reference voltage Vref. The reference voltage Vref is affected only to a small extent by changes in temperature. The control transistor unit 1130 includes the control transistor 1131 configured to generate the control voltage Vcont that increases as the environmental temperature decreases. By using the control transistor 1131, the control voltage to be supplied to the heating unit is controlled, and as a result, the breakdown withstand voltage of the transistor can be improved when the transistor is in low-temperature environment.

The power amplifier circuit 10B includes the A/D converter circuit 6011 configured to receive a temperature signal corresponding to the environmental temperature from the temperature sensor. In accordance with the temperature signal, the voltage generation unit 6013 generates the control voltage Vcont. This configuration enables heating of the heating elements to be controlled in accordance with a digital signal, and thus, heating can be carried out in a more precise manner.

In the power amplifier circuit 10, the heating element is, for example, the transistor 11411 that is configured to output the passing current based on the control voltage Vcont. With this configuration, heat based on the control voltage Vcont can be generated by the transistor 11411 providing current amplification, and as a result, it is possible to sufficiently heat the amplification unit.

In the power amplifier circuit 10A, the heating element is, for example, the resistance element 4021 through which the passing current based on the control voltage Vcont passes. The area including the resistance elements of the power amplifier circuit 10A is smaller than the area including the heating elements of the power amplifier circuit 10, and as a result, it is possible to reduce the size of the chip equipped with the power amplifier circuit and manufacturing costs.

The power amplifier circuit 10 further includes the chip 301 having a major surface parallel to a plane defined by a first direction and a second direction crossing each other. The amplification unit includes the amplifier circuit 100 and the clamp circuit 111. The amplifier circuit 100 is configured to output an output signal obtained by amplifying the radio-frequency signal. The clamp circuit 111 includes one or more diodes including the diode 1111 provided between an output of the amplifier circuit and the ground. The one or more diodes each have an anode coupled to an amplifier-circuit side and a cathode coupled to a ground side. The one or more diodes are provided at the chip 301 and coupled in series with each other. The transistor 11411 is provided at the chip 301 and positioned adjacent to the diode 1111. With this configuration, the transistors including the transistor 11411 heat the diodes 1111 to 1116 by self-heating when the environmental temperature decreases. Because the diodes 1111 to 1116 are heated, the on-voltage of each diode does not decrease as the environmental temperature decreases. By controlling the on-voltage of each diode not to decrease, the clamp circuit is switched on at a given level of voltage, and as a result, it is possible to avoid damage to the output transistor 102 when the environmental temperature decreases.

The power amplifier circuit 10C further includes the chip 901 having a major surface parallel to a plane defined by a first direction and a second direction crossing each other. The amplification unit includes the output transistor 80211 provided at the chip 901. The transistor 81411 is provided at the chip 901 and positioned adjacent to the output transistor 80211.

When temperature decreases, the transistor 81411 heats the output transistor 80211, and the junction temperature of the output transistor 80211 is increased, which hinders the avalanche phenomenon; as a result, the breakdown withstand voltage of the transistor can be improved when the transistor is in low-temperature environment.

The power amplifier circuit 10E includes the output transistor 102 and the bias circuits 1101 and 1102. The output transistor 102 is configured to amplify a radio-frequency signal and output the radio-frequency signal. The output transistor 102 is configured to generate heat that increases as the passing current increases. The bias circuits 1101 and 1102 are each configured to supply a bias current or voltage to the output transistor 102. The bias circuit 1101 includes the control transistor unit 11101 and the reference-voltage generation circuit 11102. The control transistor unit 11101 is configured to increase the bias current or voltage when the environmental temperature is a predetermined threshold or lower. The reference-voltage generation circuit 11102 is configured to generate a reference voltage independent of changes in temperature. The passing current passing through the output transistor 102 increases as the control voltage increases.

With this configuration, when temperature is relatively low, the idle current flowing to the output transistor 102 is increased, and the output transistor 102 is heated. The junction temperature of the output transistor 102 is increased, which hinders the avalanche phenomenon; as a result, the breakdown withstand voltage of the transistor can be improved when the transistor is in low-temperature environment.

The power amplifier circuit 10F includes the bias circuits 1101 and 1102. The power amplifier circuit 10F further includes the bias selection circuit 1400 configured to switch between the bias circuits 1101 and 1102 to cause the bias circuit 1101 or 1102 to supply the bias current or voltage to the output transistor 102. This configuration can switch between connection with the bias circuit 1101 and connection with the bias circuit 1102 in accordance with temperature, and as a result, the output transistor 102 can be suitably heated.

In the power amplifier circuit 10F, the radio-frequency signal is a transmit signal in a transmit time slot in TDD. The control signal indicates whether a timing is included in the transmit time slot or in a receive time slot in TDD. When the timing is in a receive time slot, the bias selection circuit 1400 causes the bias circuit 1101 to supply the bias current I1 to the output transistor 102. When the timing is in a transmit time slot, the bias selection circuit 1400 causes the bias circuit 1102 to supply the bias current I2 to the output transistor 102.

During the receive time slot R1 without amplification, the bias circuit configured to output the bias current I1 when the environmental temperature is relatively low provides a large amount of current corresponding to the environmental temperature to the output transistor 102, and as a result, the output transistor 102 heat itself by self-heating. With this configuration, the breakdown withstand voltage of the transistor can be improved when the transistor is in low-temperature environment. Moreover, in the case of TDD, output signals are used to generate heat during transmit time, whereas a bias current larger than transmit time is supplied to the output transistor 102 during receive time; consequently, the output transistor 102 can be heated more efficiently than when the bias currents I1 and I2 are supplied during both transmit and receive times.

The power amplifier circuit 10G includes the A/D converter circuit 17011 configured to receive a temperature signal corresponding to the environmental temperature from the temperature sensor. In accordance with the temperature signal, the voltage generation unit 17014 generates a control voltage. This configuration enables the idle current flowing to the output transistor 102 to be controlled in accordance with a digital signal, and thus, heating can be carried out in a more precise manner.

In the power amplifier circuit 10G, the radio-frequency signal is a transmit signal in a transmit time slot in TDD. The control signal indicates whether a timing is included in the transmit time slot or in a receive time slot in TDD. When the timing is in a receive time slot, the control circuit 1701 causes the bias circuit 1101 to supply the bias current I1 to the output transistor 102. When the timing is in a transmit time slot, the control circuit 1701 causes the bias circuit 1102 to supply the bias current I2 to the output transistor 102. With this configuration, it is possible to highly efficiently heat the output transistor 102.

The embodiments described above have been made for ease of understanding the present disclosure and should not be construed to limit the present disclosure. The present disclosure can be changed or improved without departing from its spirit and also includes equivalents thereof. This means that modifications to the embodiments designed by those skilled in the art as appropriate are also embodied in the scope of the present disclosure when the modifications have features of the present disclosure. For example, the elements included in the embodiments, the arrangements thereof, materials, conditions, shapes, sizes are not limited to the examples and may be changed as appropriate. The embodiments described above are mere examples, and as might be expected, the configurations described in the different embodiments may be partially replaced or combined with each other. These modifications are embraced within the scope of the present disclosure when these modifications contain the attributes of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A power amplifier circuit comprising:
an amplification circuit configured to amplify a radio-frequency signal;
a heating circuit provided adjacent to the amplification circuit and including one or more heating elements configured to generate heat that increases as a passing current increases; and
a control circuit coupled to the heating elements, the control circuit including a reference-voltage generation circuit configured to generate a reference voltage, and the control circuit being configured to increase the passing current in accordance with an environmental temperature and the reference voltage.

2. The power amplifier circuit according to claim 1, wherein
the control circuit includes a control-voltage generation circuit configured to generate a control voltage that increases as the environmental temperature decreases, and
the passing current passing through the one or more heating elements increases as the control voltage increases.

3. The power amplifier circuit according to claim 2, wherein
the control-voltage generation circuit includes
a control transistor circuit including a control transistor having a base configured to receive the reference voltage, the control transistor being configured to output, in accordance with the environmental temperature and the reference voltage, the control voltage that increases as the environmental temperature decreases.

4. The power amplifier circuit according to claim 3, wherein
each heating element is a unit transistor configured to output the passing current based on the control voltage.

5. The power amplifier circuit according to claim 3, wherein
each heating element is a resistance element through which the passing current based on the control voltage passes.

6. The power amplifier circuit according to claim 1, further comprising:
a chip having a major surface parallel to a plane defined by a first direction and a second direction crossing each other, wherein
the amplification circuit includes
an amplifier circuit configured to output an output signal obtained by amplifying the radio-frequency signal, and
a clamp circuit including one or more diodes provided between an output of the amplifier circuit and ground, the one or more diodes each having an anode coupled to an amplifier-circuit side and a cathode coupled to a ground side, the one or more diodes being provided at the chip and coupled in series with each other, and
the heating elements are provided at the chip and positioned adjacent to the diodes.

7. The power amplifier circuit according to claim 2, further comprising:
a chip having a major surface parallel to a plane defined by a first direction and a second direction crossing each other, wherein
the amplification circuit includes
an amplifier circuit configured to output an output signal obtained by amplifying the radio-frequency signal, and
a clamp circuit including one or more diodes provided between an output of the amplifier circuit and ground, the one or more diodes each having an anode coupled to an amplifier-circuit side and a cathode coupled to a ground side, the one or more diodes being provided at the chip and coupled in series with each other, and
the heating elements are provided at the chip and positioned adjacent to the diodes.

8. The power amplifier circuit according to claim 3, further comprising:
a chip having a major surface parallel to a plane defined by a first direction and a second direction crossing each other, wherein
the amplification circuit includes
an amplifier circuit configured to output an output signal obtained by amplifying the radio-frequency signal, and
a clamp circuit including one or more diodes provided between an output of the amplifier circuit and ground, the one or more diodes each having an anode coupled to an amplifier-circuit side and a cathode coupled to a ground side, the one or more diodes being provided at the chip and coupled in series with each other, and
the heating elements are provided at the chip and positioned adjacent to the diodes.

9. A power amplifier circuit comprising:
an output transistor configured to amplify a radio-frequency signal and output the radio-frequency signal, the output transistor being configured to generate heat that increases as a passing current increases;
a bias circuit configured to supply a bias current or voltage to the output transistor; and
a control circuit coupled to the bias circuit, the control circuit including a reference-voltage generation circuit configured to generate a reference voltage, and the control circuit being configured to increase the bias current or voltage in accordance with an environmental temperature and the reference voltage.

10. The power amplifier circuit according to claim 9, wherein
the control circuit includes a control-voltage generation circuit configured to generate a control voltage that increases as the environmental temperature decreases, and
the passing current passing through the output transistor increases as the control voltage increases.

11. The power amplifier circuit according to claim 10, wherein
the control-voltage generation circuit includes
a control transistor circuit including a control transistor having a base configured to receive the reference voltage, the control transistor being configured to output, in accordance with the environmental temperature and the reference voltage, the control voltage that increases as the environmental temperature decreases.

* * * * *